United States Patent
Cabral, Jr. et al.

(10) Patent No.: US 8,293,643 B2
(45) Date of Patent: Oct. 23, 2012

(54) METHOD AND STRUCTURE OF FORMING SILICIDE AND DIFFUSION BARRIER LAYER WITH DIRECT DEPOSITED FILM ON SILICON

(75) Inventors: Cyril Cabral, Jr., Mahopac, NY (US); John M. Cotte, New Fairfield, CT (US); Kathryn C. Fisher, Brooklyn, NY (US); Laura L. Kosbar, Mohegan Lake, NY (US); Christian Lavoie, Ossining, NY (US); Zhu Liu, Kunming (CN); Kenneth P. Rodbell, Sandy Hook, CT (US); Xiaoyan Shao, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 185 days.

(21) Appl. No.: 12/819,634

(22) Filed: Jun. 21, 2010

(65) Prior Publication Data
US 2011/0309508 A1    Dec. 22, 2011

(51) Int. Cl.
*H01L 21/477* (2006.01)

(52) U.S. Cl. .. 438/643; 438/649; 438/664; 257/E21.497

(58) Field of Classification Search .................... 438/664
See application file for complete search history.

(56) References Cited

U.S. PATENT DOCUMENTS

| | | | |
|---|---|---|---|
| 4,907,052 A | 3/1990 | Takada et al. | |
| 5,166,770 A | 11/1992 | Tang et al. | |
| 5,421,974 A * | 6/1995 | Witt | 438/565 |
| 5,891,513 A | 4/1999 | Dubin et al. | |
| 6,251,777 B1 | 6/2001 | Jeng et al. | |
| 6,294,836 B1 | 9/2001 | Paranjpe et al. | |
| 6,441,492 B1 | 8/2002 | Cunningham | |
| 7,045,861 B2 | 5/2006 | Takayama et al. | |
| 7,153,770 B2 | 12/2006 | Choi | |
| 2002/0053741 A1 | 5/2002 | Iwasaki et al. | |
| 2002/0084529 A1 | 7/2002 | Dubin et al. | |
| 2002/0180046 A1 * | 12/2002 | Wang et al. | 257/754 |
| 2005/0206000 A1 | 9/2005 | Aggarwal et al. | |

* cited by examiner

*Primary Examiner* — Stephen W Smoot
(74) *Attorney, Agent, or Firm* — Connolly Bove Lodge & Hutz LLP; Louis J. Percello, Esq.

(57) ABSTRACT

A semiconductor device or a photovoltaic cell having a contact structure, which includes a silicon (Si) substrate; a metal alloy layer deposited on the silicon substrate; a metal silicide layer and a diffusion layer formed simultaneously from thermal annealing the metal alloy layer; and a metal layer deposited on the metal silicide and barrier layers.

11 Claims, 4 Drawing Sheets

METHOD AND STRUCTURE OF FORMING SILICIDE AND DIFFUSION BARRIER LAYER WITH DIRECT DEPOSITED FILM ON SILICON

TECHNICAL FIELD

The disclosure relates to a semiconductor device having a contact structure, in which a silicon (Si) substrate has a metal layer directly deposited on it, which is then annealed to form a silicide prior to deposition of a metal, and in which the silicide may or may not be stoichiometrically distributed in the silicide. In particular, the disclosure relates to a semiconductor device having a contact structure, which includes a Si substrate, a metal layer directly deposited on the Si substrate, a metal silicide layer formed from thermal annealing the metal layer, a diffusion barrier layer formed on the metal silicide layer from barrier metal elements precipitated from the metal silicide layer, and a metal layer deposited on the silicide and barrier layers.

BACKGROUND OF THE DISCLOSURE

In microelectronics and in solar cell devices, silicide is widely used to make contact to the silicon substrate and make contact to the conductor metal. A silicide layer is formed by depositing a pure metal thin film directly on top of the silicon substrate, usually by physical vapor deposition processes, such as sputtering or evaporation, and followed by a thermal annealing process. Then, an additional barrier layer, such as TiN, W, Ta, TaN, may be deposited on the formed silicide layer, also by mostly vacuum processes, before deposition of the main conducting metal, generally copper lines. However, this approach is cost prohibitive for solar cell applications due to the use of vacuum based processes.

Silicide processes also have been widely used to form silicide contacts on the gate and source/drain of metal oxide semiconductor field effect transistors (MOSFETs) or on the emitter, base, and collector of bipolar devices. For the formation of the silicide contacts, the process generally includes forming a stable metal compound by reacting silicon and metal and reduces the sheet and contact resistance at contact regions. Such a process is useful in obtaining high performance semiconductor devices.

In addition, silicide processes or a self-aligned silicide processes have been used in fabrication of many logic devices. However, in the fields of next generation high-speed complementary metal oxide silicon (CMOS) logic devices and embedded dynamic random access memory (DRAM) devices formed by combination of logic devices and DRAM devices, there has been a need for the development of new silicide materials that can provide better results than $TiSi_2$ and $CoSi_2$ which have been mainly applied in conventional silicide processes.

Recently, nickel monosilicide (NiSi) has been proposed and studied as a silicide material suitable for a next generation ultralarge-scale integrated (ULSI) semiconductor process.

For instance, U.S. Pat. No. 7,153,770 describes a method of manufacturing semiconductor device, in which a Ni/Co alloy is annealed to form nickel monosilicide (NiSi), followed by a W deposition on the silicide. In particular, the patent describes using a thin Mo layer before putting down Ni on Si to form an inhibition layer for NiSi formation to get better silicide uniformity. However, both processes are vacuum based.

U.S. Pat. No. 6,251,777 describes a thermal annealing method, in which Si and silicide forming metal(s) are annealed to form silicides. Silicide formation by depositing extra silicon layer to react with metal, which is also a vacuum based process.

U.S. Pat. No. 4,907,052 describes semiconductor tandem solar cells, in which NiSi is formed on Si, and a diffusion layer. In particular, the patent describes a metal silicide layer as a blocking layer between p-Si and n-Si dopants interdiffusion.

U.S. Pat. No. 5,166,770 describes silicide structures, in which a diffusion barrier is formed prior to a conductive metal deposition. In particular, the patent describes the traditional self-aligned silicide process for MOSFET devices using Ti, Ta, or Mo silicide as contact to p-Si region of the device, which is also a vacuum based process only.

This disclosure illustrates a method to form a silicide layer and a diffusion barrier layer simultaneously from a metal alloy layer on silicon substrates during a thermal annealing process, with the metal alloy layer deposited by either solution or vacuum processes. This significantly reduces the process steps and reduces cost of processing.

SUMMARY OF THE DISCLOSURE

The present disclosure relates to a semiconductor device having a contact structure and an alternative method of depositing a layer of a metal alloy for silicide and diffusion barrier layer formations.

In one aspect of the disclosure, the semiconductor device has a contact structure, which comprises:
 a silicon (Si) substrate;
 a metal alloy layer directly deposited on the silicon substrate;
 a metal silicide layer and a diffusion barrier layer formed simultaneously from thermal annealing the metal alloy layer; and
 a metal layer deposited on the metal silicide and barrier layers.

In another aspect of the disclosure, the method for producing the semiconductor device having a contact structure comprises:
 providing a device having a silicon (Si) substrate;
 depositing a metal alloy layer on the Si substrate;
 thermal annealing the metal alloy layer;
 forming a metal silicide layer and a diffusion barrier layer simultaneously from thermal annealing the metal alloy layer; and
 depositing a metal layer on the metal silicide and barrier layers.

DETAILED DESCRIPTION OF THE DISCLOSURE

A more complete appreciation of the disclosure and many of the attendant advantages will be readily obtained, as the same becomes better understood by reference to the following detailed description when considered in connection with the accompanying drawings.

Figure 1:
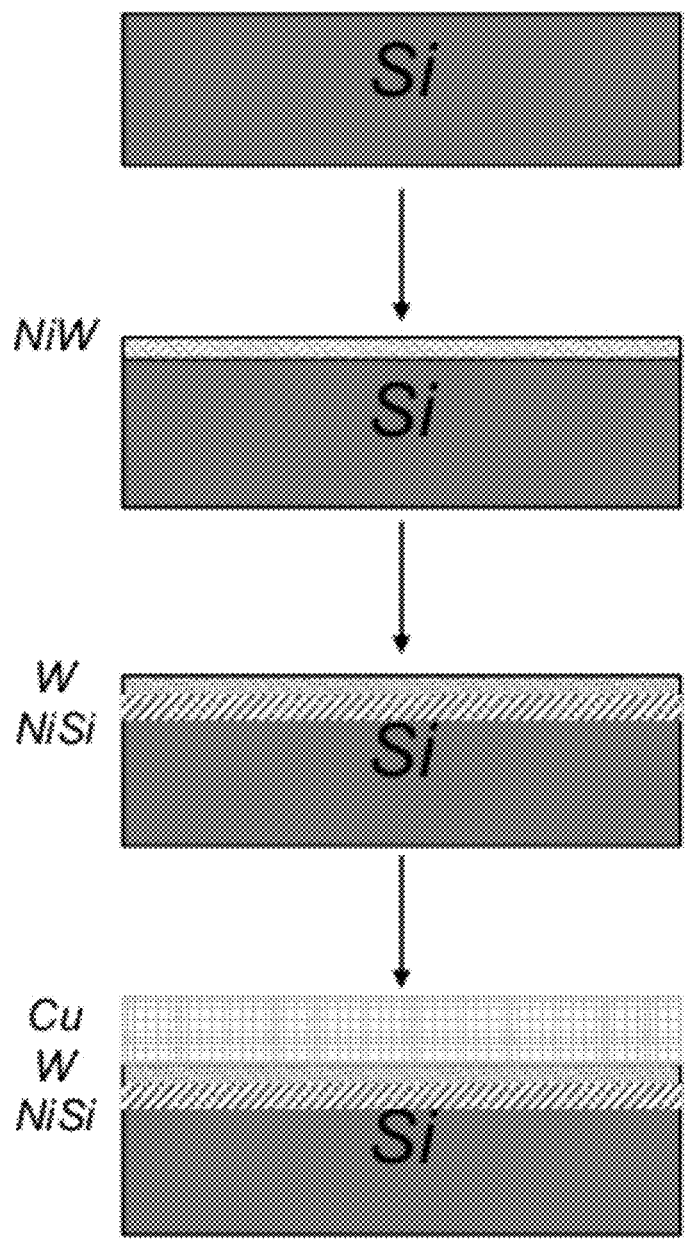
FIG. 1 illustrates an embodiment of the contact structure of the disclosure with direct deposition of a NiW layer on a Si substrate, and metal silicide formation.

FIG. 1 shows a contact structure and method for the direct deposition of a metal alloy layer, such as NiW, on a silicon (Si) substrate for producing a semiconductor device. In a preferred embodiment, the semiconductor device is a complementary metal oxide silicon (CMOS) logic device, a memory device, an embedded memory device, or a photovoltaic cell.

In a preferred embodiment, the Si substrate is made of one selected from the group consisting of monocrystalline Si, polycrystalline Si, doped Si, amorphous Si, $Si_xGe_{1-x}$ where x is any number satisfying 0<x<1, $Si_xN_{1-x}$ where x is any number satisfying 0<x<1, and SiC.

The metal alloy layer directly deposited on the Si substrate in the contact structure may be deposited by any method commonly used in the electronics industry. The deposition techniques include electrodeposition, e-beam evaporation, chemical vapor deposition (CVD), physical vapor deposition (PVD), molecular beam epitaxy (MBE), or sputtering. In a preferred embodiment, the metal alloy layer is made of at least one metal selected from the group consisting of Ni, Co, Pt, Pd, Ta, Ti, Nb, V, Hf, Zr, Mo, W and alloys thereof. The thickness of the metal layer is about 1 to 1,000 nm, with 10 to 200 nm being more typical.

FIGS. 1 to 4 show the formation of a metal silicide layer in the contact structure, in which the silicide may or may not be stoichiometrically distributed in the silicide. In a preferred embodiment, the metal alloy layer is thermal annealed at a temperature of about 100 to 1,000° C., with 200° C. to 600° C. being more typical. The silicide layer formed from the thermal annealing is preferably composed of nickel silicide. In addition, the metal silicide layer is typically from about 10 nm to 200 nm in thickness, and more preferably from about 10 nm thick to about 50 nm.

Figure 2:
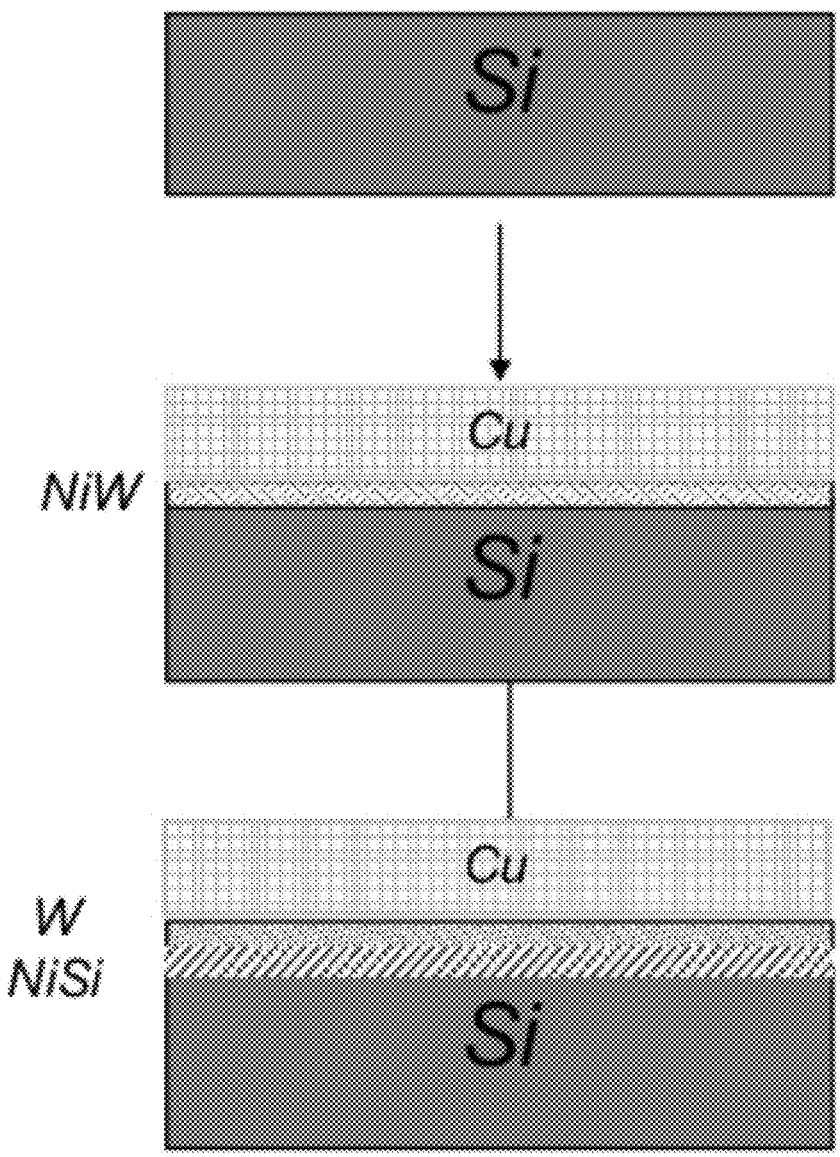
FIG. 2 illustrates an embodiment of the contact structure of the disclosure with direct deposition of a NiW on silicon, and then depositing a Cu layer on the NiW surface, annealing to form a metal silicide layer simultaneously with a W layer and a Cu layer.
Figure 3:
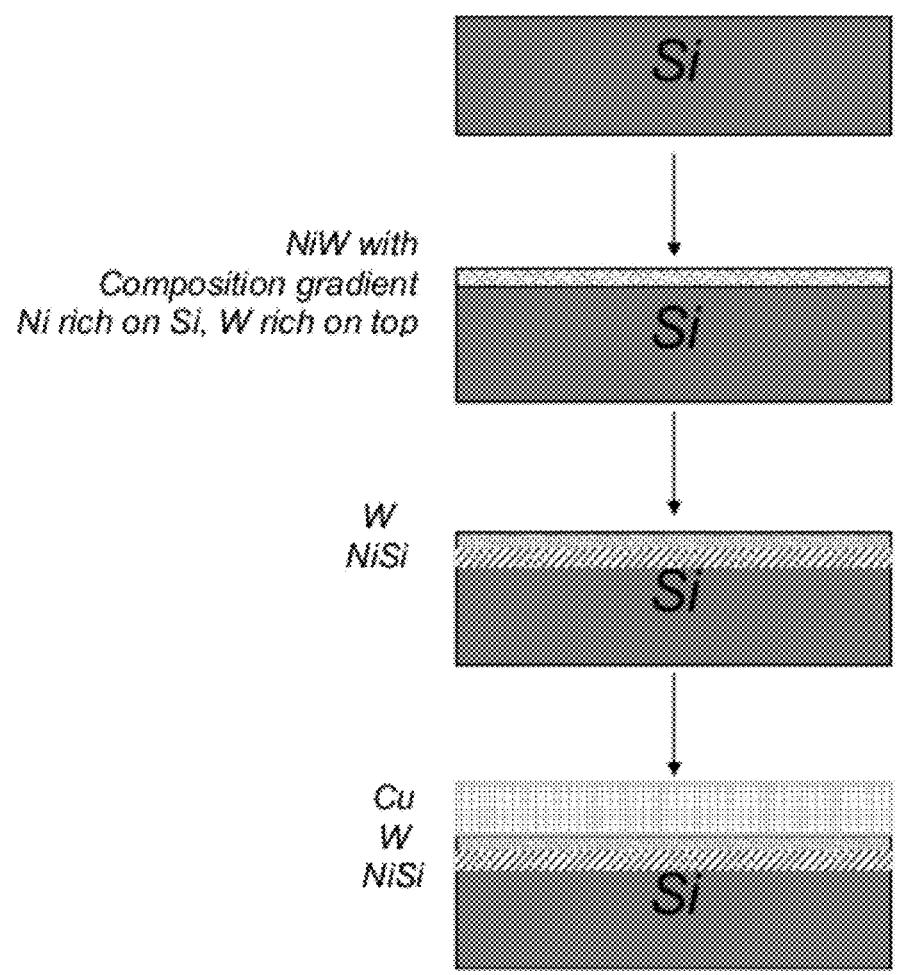
FIG. 3 illustrates an embodiment of the contact structure of the disclosure with direct deposition of a NiW layer on a Si substrate with a gradient composition Si, Ni and W, metal silicide formation, and Cu deposited on top.
Figure 4:
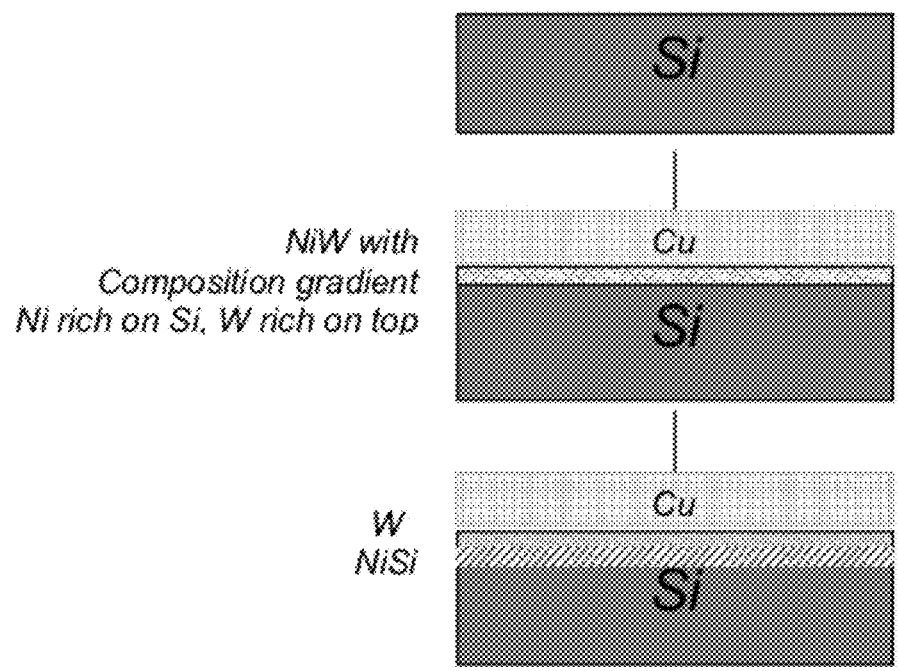
FIG. 4 illustrates an embodiment of the contact structure of the disclosure with direct application of NiW on a Si substrate with a gradient composition Si, Ni and W directly on silicon, depositing a Cu layer, and then annealing to form a metal silicide simultaneously with a W layer and a Cu layer.

In a preferred embodiment, the metal alloy layer includes Ni and W, or is a composition gradient of Ni and W, as shown in FIG. 3 and FIG. 4. In another preferred embodiment, the metal alloy layer is thermally annealed, in which a metal silicide layer is formed on the metal layer, as shown in FIGS. 1 to 4. In addition, as shown in FIGS. 1 to 4, a metal layer is deposited on the silicide and diffusion barrier layers, in which the metal layer is preferably Cu, Ag, Au, Ni, or Co and the metal silicide layer is preferably a nickel silicide layer.

Specifically, FIG. 2 illustrates a preferred embodiment of the contact structure, in which a NiW layer is directly deposited on a Si substrate, and Cu is deposited on the NiW layer, and a nickel silicide layer is formed upon thermal annealing. FIG. 3 illustrates a preferred embodiment of the contact structure with direct deposition of a NiW layer on a Si substrate with a gradient composition Si, Ni, and W, and the formation of a nickel silicide layer and a diffusion barrier layer simultaneously upon annealing, and then a metal Cu layer is deposited on top. FIG. 4 also illustrates a preferred embodiment of the contact structure with direct application of NiW on a Si substrate with a gradient composition Si, Ni, and W, and then Cu deposited on top, and upon annealing to form a nickel silicide layer and a W diffusion barrier layer simultaneously and a Cu layer on top surface. The W diffusion barrier layer is formed on the metal silicide layer from barrier metal elements which precipitate from the metal alloy layer. The diffusion barrier layer has a thickness of about 0.1 to 10 nm.

The various layers described throughout the disclosure may be deposited by other techniques described in publications, which include U.S. Pat. No. 5,891,513, U.S. Pat. No. 6,294,836, U.S. Pat. No. 6,441,492, U.S. Pat. No. 7,045,861, U.S. Publication No. 2002/0053741 and U.S. Publication No. 2002/0084529 and U.S. Publication No. 2005/0206000, the contents of which are herein incorporated by reference.

Other materials, such as germanium, gallium arsenide or other semiconductors, which can use silicides or other compounds (borides, nitrides, aluminides, and so forth) may use the inventive features with the corresponding materials.

Obviously, numerous modifications and variations of the disclosure are possible in light of the above disclosure. It is therefore understood that within the scope of the appended claims, the disclosure may be practiced otherwise than as specifically described herein.

What is claimed is:

1. A method for producing a semiconductor device having a contact structure, which comprises:
   a. providing a device having a silicon (Si) substrate;
   b. depositing a metal alloy layer on the Si substrate;
   c. thermal annealing the metal alloy layer;
   d. forming a metal silicide layer and a diffusion barrier layer simultaneously; and
   e. depositing a metal layer on the silicide and barrier layers;
   wherein the metal alloy layer comprises Ni and W, or is formed as a composition gradient of Ni and W on the Si substrate.

2. The method according to claim 1, wherein the Si substrate is made of one selected from the group consisting of monocrystalline Si, polycrystalline Si, doped Si, amorphous Si, $Si_xGe_{1-x}$ where x is any number satisfying 0<x<1, $Si_xN_{1-x}$ where x is any number satisfying 0<x<1, and SiC.

3. The method according to claim 1, wherein the metal layer deposited on the metal silicide and barrier layers is Cu, Ni, Co, Ag, or Au.

4. The method according to claim 1, wherein the diffusion barrier layer has a thickness of about 0.1 to 10 nm.

5. The method according to claim 1, wherein the metal alloy layer has a thickness of about 1 to 1,000 nm.

6. The method according to claim 1, wherein the metal alloy layer has a thickness of 10 to 200 nm.

7. The method according to claim 1, wherein the metal alloy layer is annealed at a temperature of about 100° C. to 1,000° C., with 200° C. to 600° C. being more typical.

8. The method according to claim 1, wherein the metal alloy layer is annealed at a temperature of 200° C. to 600° C.

9. The method according to claim 1, wherein the metal alloy is formed by electrodeposition, e-beam evaporation, chemical vapor deposition (CVD), physical vapor deposition (PVD), molecular beam epitaxy (MBE), or sputtering.

10. The method according to claim 1, wherein the semiconductor device is a complementary metal oxide silicon (CMOS) logic device, a memory device, an embedded memory device, or a photovoltaic cell.

11. The method according to claim 1, wherein the metal silicide layer is a nickel silicide layer.

* * * * *